(12) United States Patent
Smith et al.

(10) Patent No.: US 6,651,129 B1
(45) Date of Patent: Nov. 18, 2003

(54) APPARATUS AND METHOD FOR ESTABLISHING A DATA COMMUNICATION INTERFACE TO CONTROL AND CONFIGURE AN ELECTRONIC SYSTEM WITH ANALOG AND DIGITAL CIRCUITS

(75) Inventors: Gregory J. Smith, Tucson, AZ (US); Jeffrey P. Kotowski, Nevada City, CA (US); William J. McIntyre, Wheatland, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 623 days.

(21) Appl. No.: 09/614,081

(22) Filed: Jul. 11, 2000

Related U.S. Application Data (60) Provisional application No. 60/146,098, filed on Jul. 21, 1999.

(51) Int. Cl.[7] .......................... G06F 13/00; G06F 11/00
(52) U.S. Cl. ..................... 710/316; 714/740; 714/742
(58) Field of Search ........................... 710/305, 316, 710/11; 714/45, 724, 726, 727, 733, 755; 716/17; 711/167, 163; 324/73.1; 327/24; 370/475; 340/504; 375/260; 341/53

(56) References Cited

U.S. PATENT DOCUMENTS

| | | | | |
|---|---|---|---|---|
| 4,857,834 A | * | 8/1989 | Sukemura .................. 324/73.1 |
| 4,860,290 A | * | 8/1989 | Daniels et al. ............... 714/726 |
| 5,404,358 A | * | 4/1995 | Russell ........................ 714/727 |
| 5,434,862 A | * | 7/1995 | Lokhoff ....................... 370/475 |
| 5,506,851 A | * | 4/1996 | Fuse ............................. 714/724 |
| 5,568,493 A | * | 10/1996 | Morris ......................... 714/726 |
| 5,710,934 A | * | 1/1998 | Bona et al. ................... 714/724 |
| 5,757,822 A | * | 5/1998 | Fisher et al. ................. 714/755 |
| 5,793,778 A | * | 8/1998 | Qureshi ....................... 714/727 |
| 6,020,834 A | * | 2/2000 | Rider ........................... 341/53 |
| 6,038,400 A | * | 3/2000 | Bell et al. ...................... 710/11 |
| 6,145,100 A | * | 11/2000 | Madduri ....................... 714/45 |
| 6,148,384 A | * | 11/2000 | Devanagundy et al. ...... 711/163 |
| 6,202,183 B1 | * | 3/2001 | Ginetti et al. ................ 714/726 |
| 6,205,182 B1 | * | 3/2001 | Pardini et al. ............... 375/260 |
| 6,218,869 B1 | * | 4/2001 | Hongbin Hao et al. ........ 327/24 |
| 6,357,037 B1 | * | 3/2002 | Burnham et al. .............. 716/17 |
| 6,366,990 B1 | * | 4/2002 | Guddat et al. ............... 711/167 |
| 6,367,043 B1 | * | 4/2002 | Damarla ...................... 714/733 |
| 6,389,567 B2 | * | 5/2002 | Porteners et al. ............ 714/733 |
| 6,408,414 B1 | * | 6/2002 | Hatada ........................ 714/727 |
| 6,498,563 B1 | * | 12/2002 | Tice et al. .................... 340/504 |

OTHER PUBLICATIONS

Gray Creager, (Application Notes) "AN44:Variable Precision Reference using DCPs", Jul. 1996, pps. 1–7.

* cited by examiner

*Primary Examiner*—Glenn A. Auve
*Assistant Examiner*—Christopher E. Lee
(74) *Attorney, Agent, or Firm*—Vedder, Price, Kaufman & Kammholz, P.C.

(57) ABSTRACT

A system and method for providing for on-chip configuration, control and testing of mixed signal circuitry within an integrated circuit. A dual signal interface conveys the serial data and clock signals used for controlling the enablement, disablement and operational modes of the synchronous circuitry responsible for such on-chip configuration, control and testing, thereby minimizing the amount of overhead, in terms of interface terminals needed, for providing such capability.

22 Claims, 10 Drawing Sheets

APPARATUS AND METHOD FOR ESTABLISHING A DATA COMMUNICATION INTERFACE TO CONTROL AND CONFIGURE AN ELECTRONIC SYSTEM WITH ANALOG AND DIGITAL CIRCUITS

RELATED APPLICATIONS

This application claims the benefit of U.S. Provisional Application No. 60/146,098, filed Jul. 21, 1999, and entitled "Apparatus And Method For Establishing A Data Communication Interface To Control And Configure An Electronic System With Analog And Digital Circuits."

FIELD OF THE INVENTION

The present invention relates to electronic systems with both analog and digital circuits, and in particular, to electronic systems with circuits that receive external signals and establish a data communications interface for controlling and configuring the analog and digital portions of the system.

BACKGROUND OF THE INVENTION

One of the problems associated with electronic systems is the need to correct for non-idealities inherent in the analog portions of the system. For example, device mismatches in the analog sections of a system can cause voltage offsets that can have deleterious effects on the behavior the overall electronic system. Various non-idealities in analog systems and their corresponding impacts are known by those skilled in the art of analog circuit design. Analog circuit design is the art of precisely measuring and conditioning voltages and currents. The trend is always to amplify a signal with less noise, less offset, and more gain accuracy. To accomplish this, analog circuit designers have developed many building blocks: operational amplifiers, bandgap references, etc. But the quest to produce higher accuracy has led to a need for final adjustment of the circuit performance. In order to improve performance, various methods have been used to eliminate the effects of non-idealities. At the PCB (printed circuit board) level, potentiometer adjustment has been used for improve accuracy. Prior art methods implemented at the circuit level during production include various trimming techniques which are well known in the art, such as laser or current trimmable resistors or zener zapping. However, prior art trimming techniques are traditionally very expensive to implement during production and add to the cost of the electronic system.

Additionally, electronic systems can be designed to be reconfigured to perform different analog and digital functions. The systems are therefore useable in a range of applications. Such systems can be designed to receive signals which can reconfigure the system into different modes of operation.

Thus, there is a need for a way of eliminating non-idealities in analog circuits which can be cost effectively implemented during the production process. Additionally, there is a need for providing a data communication link which can be used for controlling and configuring the behavior and performance of the electronic system.

SUMMARY OF THE INVENTION

A system and method in accordance with the present invention provides for on-chip configuration, control and testing of mixed signal circuitry within an integrated circuit. A dual signal interface conveys the serial data and clock signals used for controlling the enablement, disablement and operational modes of the synchronous circuitry responsible for such on-chip configuration, control and testing, thereby minimizing the amount of overhead, in terms of interface terminals needed, for providing such capability.

In accordance with one embodiment of the present invention, an integrated circuit with mixed signal circuitry and configuration, control and testing circuitry for the mixed signal circuitry includes input terminals, interface terminals, interface circuitry, memory circuitry, analog circuitry and switching circuitry. The input terminals convey input signals including configuration control signals, while the interface terminals convey interface signals including analog interface signals. The interface circuitry, coupled to the input terminals, provides configuration data and switch control signals in response to the configuration control signals. The memory circuitry, coupled to the interface circuitry, stores the configuration data. The analog circuitry, coupled to the memory circuitry, includes internal and external circuit terminals, is electrically configurable and communicates internal and external analog signals via the internal and external circuit terminals, respectively, in response to a portion of the configuration data. The switching circuitry, coupled between the internal, external and interface terminals, alternately couples respective ones of the internal and external circuit terminals to corresponding ones of the interface terminals in response to the switch control signals. Respective ones of the internal and external analog signals change in response to corresponding changes in respective ones of the portion of configuration data.

In accordance with another embodiment of the present invention, control circuitry with a dual signal interface for controlling enablement and disablement of a synchronous system includes a data signal terminal, a clock signal terminal and an enablement control circuit. The data signal terminal conveys a serial data signal with first and second opposing signal states and first and second opposing signal transitions between the first and second opposing data signal states. The clock signal terminal conveys a clock signal with first and second opposing signal states and first and second opposing signal transitions between the first and second opposing clock signal states. The enablement control circuit, coupled to the data and clock signal terminals, provides a system enablement control signal with asserted and nonasserted signal states. An asserted system enablement control signal is provided in response to the data and clock signals following reception of a predetermined sequence of the first and second opposing data signal states and the first and second opposing clock signal state transitions, wherein the predetermined sequence includes: an initial first clock signal state transition coincident with the first data signal state; and coincidence of respective ones of the first and second opposing data signal states and the first and second opposing clock signal state transitions. A nonasserted system enablement control signal is provided in response to the first clock signal state having a duration greater than a predetermined interval.

In accordance with still another embodiment of the present invention, control circuitry with a dual signal interface for controlling the operational modes of a synchronous system includes a data signal terminal, a clock signal terminal and a mode control circuit. The data signal terminal conveys a serial data signal with first and second opposing signal states and first and second opposing signal transitions between the first and second opposing data signal states. The clock signal terminal conveys a clock signal with first and second opposing signal states and first and second opposing signal transitions between the first and second opposing clock signal states. The mode control circuit, coupled to the data and clock signal terminals, provides operation mode control signals with respective asserted and nonasserted signal states. An asserted operation mode control signal is provided in response to the data and clock signals following reception of a predetermined sequence of the first and second opposing data signal states and the first and second opposing clock signal state transitions, wherein the predetermined sequence includes: coincidence of the first clock signal state transitions with the second data signal state; and coincidence of respective ones of the first and second opposing data signal states and the second opposing clock signal state transitions. Nonasserted operation mode control signals are provided in response to the first clock signal state having a duration longer than a predetermined interval.

In accordance with yet another embodiment of the present invention, control circuitry with a dual signal interface for controlling enablement, disablement and the operational modes of a synchronous system includes a data signal terminal, a clock signal terminal, an enablement control circuit and a mode control circuit. The data signal terminal conveys a serial data signal with first and second opposing signal states and first and second opposing signal transitions between the first and second opposing data signal states. The clock signal terminal conveys a clock signal with first and second opposing signal states and first and second opposing signal transitions between the first and second opposing clock signal states. The enablement control circuit, coupled to the data and clock signal terminals, provides a system enablement control signal with asserted and nonasserted signal states. An asserted system enablement control signal is provided in response to the data and clock signals following reception of a predetermined sequence of the first and second opposing data signal states and the first and second opposing clock signal state transitions, wherein the predetermined sequence includes: an initial first clock signal state transition coincident with the first data signal state; and coincidence of respective ones of the first and second opposing data signal states and the first and second opposing clock signal state transitions. A nonasserted system enablement control signal is provided in response to the first clock signal state having a duration greater than a predetermined interval. The mode control circuit, coupled to the enablement control circuit and the data and clock signal terminals, provides operation mode control signals with respective asserted and nonasserted signal states. An asserted operation mode control signal is provided in response to the asserted system enablement control signal and the data and clock signals following reception of a predetermined sequence of the first and second opposing data signal states and the first and second opposing clock signal state transitions, wherein the predetermined sequence includes: coincidence of the first clock signal state transitions with the second data signal state; and coincidence of respective ones of the first and second opposing data signal states and the second opposing clock signal state transitions. Nonasserted operation mode control signals are provided in response to the first clock signal state having a duration longer than a predetermined interval, and in response to the nonasserted system enablement control signal.

These and other features and advantages of the present invention will be understood upon consideration of the following detailed description of the invention and the accompanying drawings.

BRIEF DESCRIPTION OF THE DRAWINGS

The present invention is illustrated by way of example and not limitation in the accompanying drawings, in which like references indicate similar elements, and in which.

DETAILED DESCRIPTION OF THE INVENTION

Figure 1:
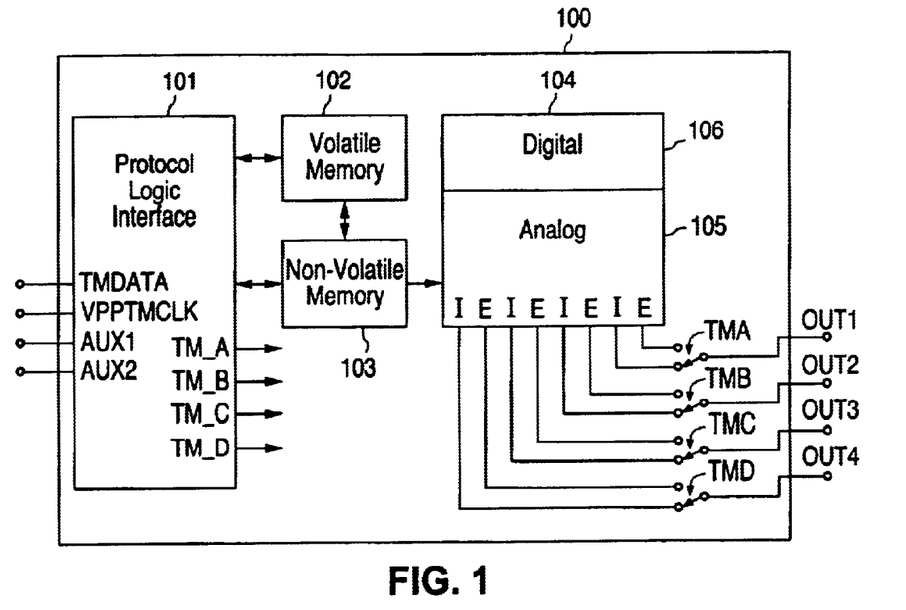
FIG. 1 is a diagram of a electronic system with a protocol interface for controlling and configuring the analog and digital portions of the system in accordance with one embodiment of the present invention.

Referring to FIG 1, an electronic system 100 according to one embodiment of the present invention is shown. The electronic system 100 includes a protocol logic interface 101, volatile memory 102, non-volatile memory 103, and mixed signal circuitry 104 having an analog portion 105 and a digital portion 106, for example. The mixed signal circuitry also includes a plurality of access lines to external nodes E and internal nodes I. External nodes are circuit nodes that are connected to the system output pins during normal operation. Internal nodes may be critical points in the analog portion of the system. Finally, electronic system 100 includes a plurality of switches TMA, TMB, TMC, and TMD, for selectively connecting either the internal nodes or the external nodes to corresponding output pins OUT1, OUT2, OUT3 and OUT4, respectively, of the electronic system.

In the embodiment of FIG. 1, a data communication interface is established by the protocol logic interface over the input pins TMDATA and VPPTMCLK. In another embodiment the input pins AUX1 and AUX2 can also be used to establish the data communication interface. Control and configuration information is received and processed by the protocol logic interface 101. Control and configuration information may be stored in either a volatile memory 102 or a non-volatile memory 103. The control and configuration information is then used to adjust the electrical characteristics of the analog portion of the system and to change the configuration of the analog and digital portions of the system. Additionally, the control and configuration information may put the electronic system into one of the various test modes. In the embodiment shown in FIG. 1, four possible test modes exist: TM_A, TM_B, TM_C, and TM_D. When one of the test modes is activated the system may cause one of the switches TMA, TMB, TMC, or TMD to connect one of the internal nodes I to an output pin. Alternatively, if the system is in a test mode, the electronic system may be reconfigured from a normal configuration into some other configuration.

The electronic system 100 of FIG. 1 includes four test modes A, B, C, and D, for example. When the protocol logic interface receives certain control and configuration signals, the system will enter a predetermined test mode configuration. For example, when the protocol logic interface receives the proper control and configuration information to activate test mode A, the test mode A output will activate a switch TMA that will cause an internal node of the analog circuit to be connected to one of the outputs of the electronic system. While in such a configuration, critical internal nodes of the analog circuits can be measured and additional control and configuration information can be transmitted to the protocol logic interface to cause internal adjustments to the analog circuit. For example, control information can be transmitted to the protocol logic interface and stored in the volatile memory. The value stored in the volatile memory can then be used to program a digital to analog converter that has an output coupled to a critical internal node of the analog circuit, thereby causing a minor change in the state of the internal node. The effect of such adjustments on critical internal nodes can be monitored externally and a range of control signals can be transmitted to the protocol logic interface to cause the digital to analog converter to move through a range of values. In this manner, a search can be implemented to obtain the optimum value of the internal node. After the optimum values of the critical internal analog nodes are determined, the value in the volatile memory can be programmed into the non-volatile memory. The electronic system may then receive more external signals which deactivate the test mode A output and cause switch TMA to disconnect the internal node from the output pin and reconnect an external node to the output pin. The system may then undergo additional testing and the part can be powered down and shipped to a customer. Other test modes can cause other external pins to be disconnected from other output pins and cause other critical internal pins to be connected to the output pins of the electronic system, for example.

Additionally, the protocol interface may receive control and configuration information which causes the digital and/or analog portions of the chip to be reconfigured to perform different analog and digital functions. For example, internal analog amplifiers may be switched in or out of a signal path, voltage measurement circuits can be connected or disconnected from an output node, and internal offset or gain values can be adjusted, all of which will change the operational characteristics of the electronic system.

Figure 2:
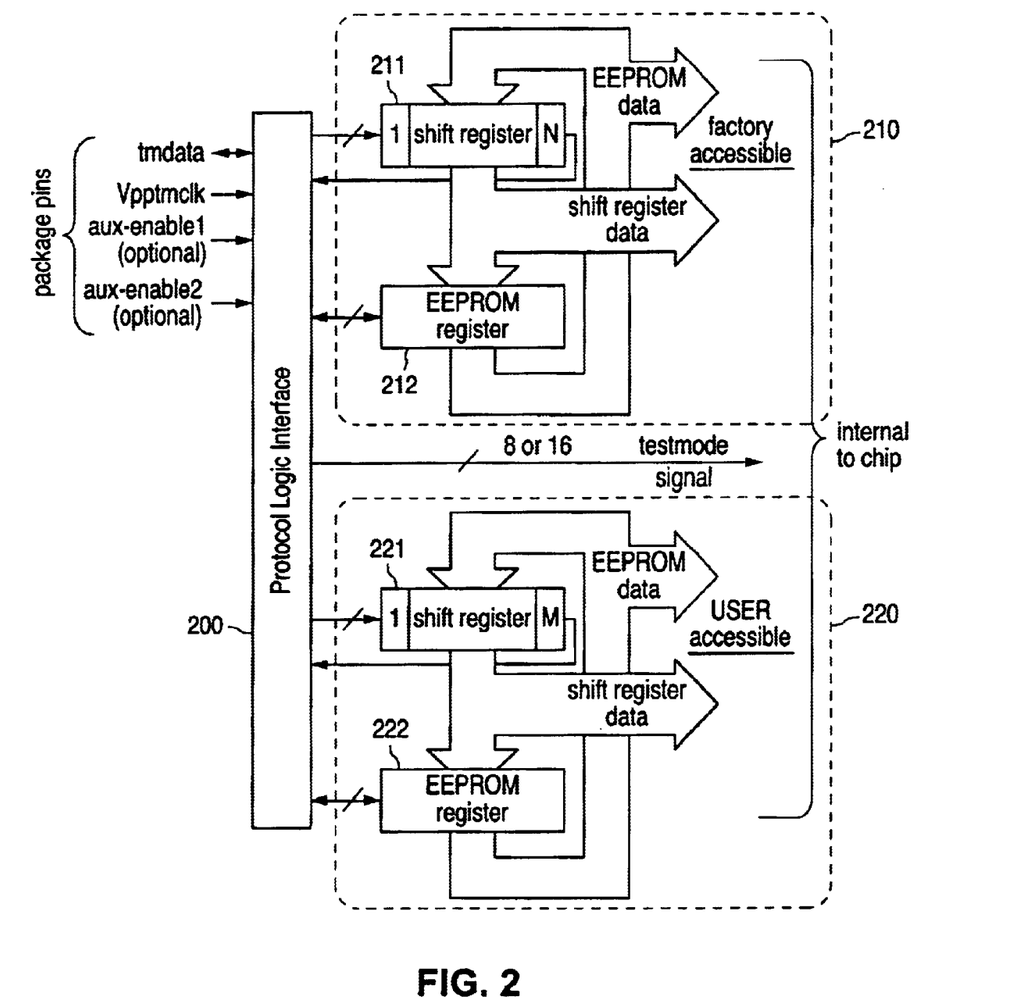
FIG. 2 is a diagram of a protocol logic interface having a factory programmable control and configuration memory and a user programmable control and configuration memory in accordance with one embodiment of the present invention.

FIG. 2 illustrates the protocol logic interface and memory portions of an electronic system according to another embodiment of the present invention. The protocol logic interface 200 of FIG. 2 is configured to communicate with two types of volatile and non-volatile memory units. The first memory unit 210 is for storing control and configuration data associated with factory settings. For example, digital to analog converter values necessary to eliminate offset voltages in a chip can be determined and stored in the first memory unit 210 and locked in a manner describe below. The first memory unit includes an N-bit shift register 211 and an N-bit electrically erasable/programmable read only memory ("EEPROM") register 212. Each register is configured to communicate data and control information with the protocol logic interface. Additionally, the data stored in each register can be communicated with the analog and digital portions of the system. (While the following disclosure discusses the use of EEPROMs for the nonvolatile memory, it will be readily understood that other forms of nonvolatile memory can be used in practicing the presently claimed invention. For example, another useful form of nonvolatile memory would involve one-time programmable memory elements, such as an electrically programmable read only memory, or EPROM. Still another form would involve the use of "fuses," such as polysilicon or metal, that are selectively "blown" to produce an array of open circuit elements. Yet another form would involve the use of "antifuses" in which circuit components, such as zener diodes, are selectively "zapped" to produce an array of shorted circuit elements.)

The second unit 220 is for storing control and configuration data associated with user settings. For example, the user can configure the electronic system to perform different functions according to his application or control the performance of the analog circuits to meet particular specifications of the user application. The control and configuration data in the second memory unit can be programmed by the user and locked down in a manner described below. The second memory unit 220 also includes an N-bit shift register 221 and an N-bit EEPROM register 222. Each. register is configured to communicate data and control information with the protocol logic interface. Additionally, the data stored in each register can be communicated with the analog and digital portions of the system.

Figure 3:
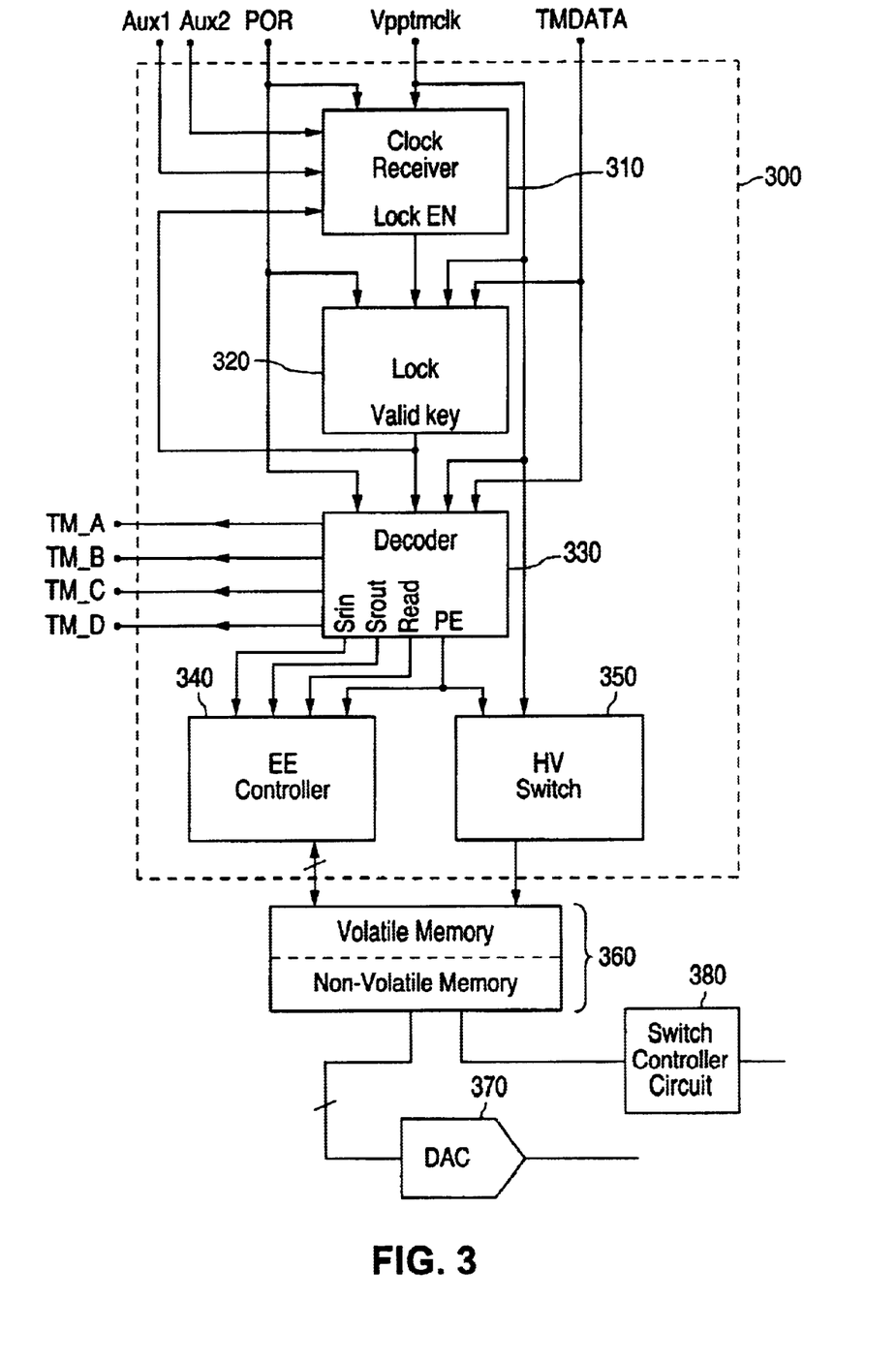
FIG. 3 is a diagram of a protocol logic interface in accordance with one embodiment of the present invention.

A protocol logic interface and corresponding memory unit according to one embodiment of the present invention are further illustrated in FIG. 3. The protocol logic interface 300 includes an optional clock receiver circuit 310, a lock circuit 320, a decoder circuit 330, an EE controller circuit 340, and a high voltage switch circuit ("HV switch") 350. The HV switch is responsive to the PE output of the decoder circuit and is used to couple the VPPTMCLK to the non-volatile memory for programming the memory as describe further below. The protocol logic interface is coupled to the memory unit 360 that contains both volatile memory and non-volatile memory. The memory unit is coupled to one or more digital to analog converters ("DAC") 370 and one or more switch controller circuits 380. Both the DACs and the switch controller circuits can be programmed by the memory unit either for trimming the device or for selectively configuring the device to perform different types of electronic functions. Additionally, the protocol logic interface of the present embodiment includes four test mode outputs TM_A, TM_B, TM_C, and TM_D. In one embodiment, the system includes a power-on-reset signal POR which can be supplied to the interface either internally or externally.

Figure 4:
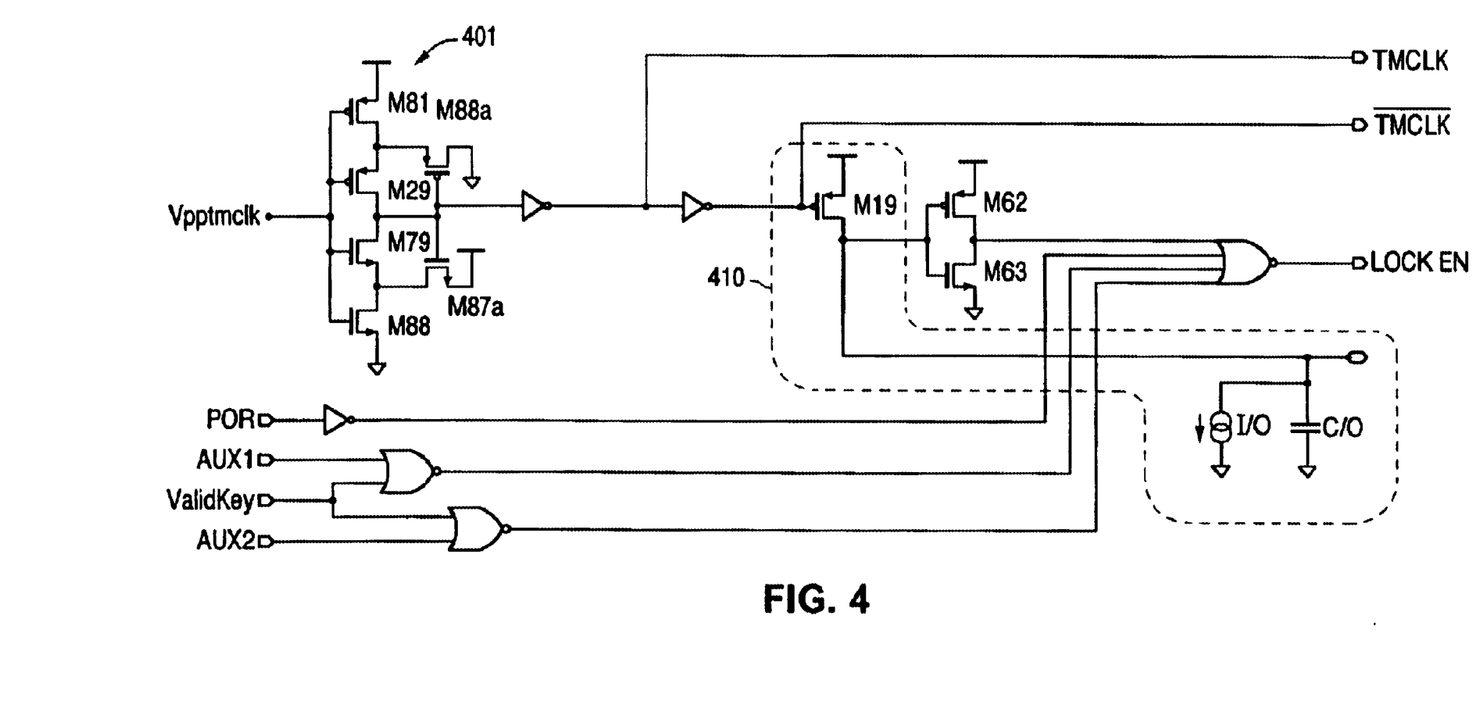
FIG. 4 is a diagram of a clock receiver portion of the protocol logic interface in accordance with one embodiment of the present invention.

The protocol logic interface unit 300 establishes a communication link by receiving the VPPTMCLK and TMDATA at its inputs. Optionally, the AUX1, AUX2, and POR signals may also be used to provide additional protection for the data stored in the memory units. For the purposes of the following explanation, we will assume that only VPPTMCLK and TMDATA are used to establish a communication link. VPPTMCLK is transmitted to the clock receiver input 310. The clock receiver checks the characteristics of the clock signal and, if the clock signal is a valid clock signal, transmits a lock EN (enable) output to the lock circuit 320. The lock EN signal is a prerequisite to entering the key sequence into the lock circuit 320 for enabling the decoder 330 as will be described in more detail below. One embodiment of the clock receiver is illustrated in FIG. 4 which includes the POR, AUX1, and AUX2 inputs to provide additional security for the data. VPPTMCLK is received by a schmidt trigger input circuit 401 comprised of transistors M29, M79–81, M87, and M88. VPPTMCLK is then received by a pole network circuit 410 comprised of PMOS transistor M19, current source I10, and capacitor C10. This circuit determines the maximum allowable low time for the VPPTMCLK which can result in the lock EN signal during or after a VALIDKEY unlocking sequence. The pole network circuit keeps the lock EN signal high for a given period of time. If the VPPTMCLK input is low for too long, the bias current I10 will discharge the capacitor C10 below the input threshold of the inverter M62/M63. That will cause lock EN to go low, making it impossible to unlock the system, as described below. Additionally, lock EN requires that POR, AUX1, and AUX2 are all high for the clock receiver to output a high signal. After the VALIDKEY input to the clock receiver goes high, as explained below, then the AUX1 and AUX2 pins are free to be used for other chip functions. The AUX1 and AUX2 inputs provide for additional security against accidental access to the memory unit or accidental activation of one of the test mode states. Finally, in the embodiment shown in FIG. 4, VPPTMCLK is buffered and split into tmclk and tmclkbar before being transmitted to the lock circuit 320.

Figure 5A:
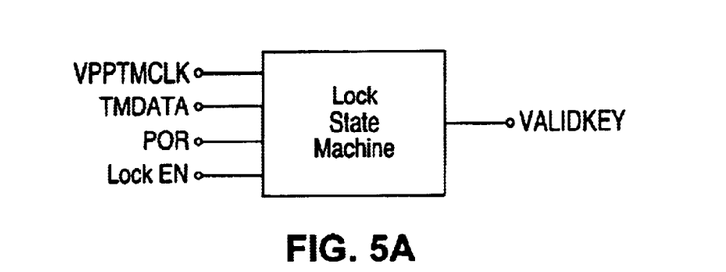
FIG. 5A is a diagram of a lock circuit portion of the protocol logic interface in accordance with one embodiment of the present invention.
Figure 5B:
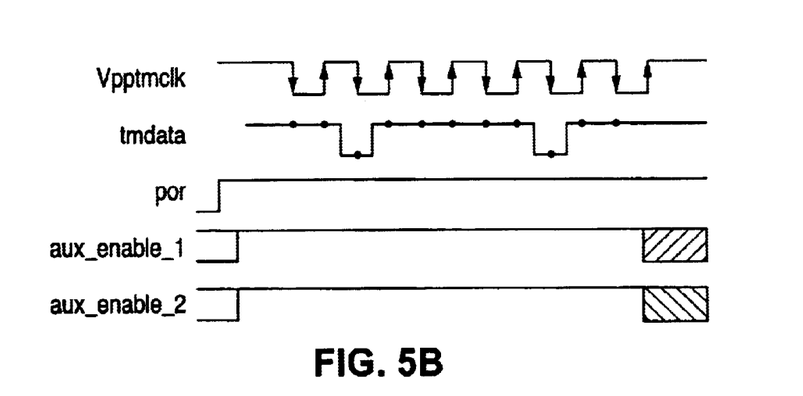
FIG. 5B is a timing diagram for illustrating the key portion of the communication protocol in accordance with one embodiment of the present invention.

The operation of the lock circuit 320 of FIG. 3 and the protocol for unlocking the protocol logic interface will now be described. FIG. 5A and FIG. 5B illustrate a lock circuit according to one embodiment of the present invention. As shown in FIG. 5A, the lock circuit is comprised of a state machine which receives VPPTMCLK, TMDATA, and lock EN as inputs. Additionally, the lock circuit may also optionally receive a POR signal for use in resetting the state machine to its zero, or initial, state. Before any test mode can be entered and before data can be stored in the memory unit, the decoder 330 of FIG. 3 must be unlocked by the lock circuit. This is accomplished by providing a state machine which only provides a VALIDKEY output signal when a predetermined sequence of both VPPTMCLK and TMDATA have been received. FIG. 5B illustrates an example of a timing sequence required to produce a valid signal on the VALIDKEY output according to one embodiment of the present invention. VPPTMCLK and TMDATA must be initially high to enter a valid key. Each rising and falling edge of the VPPTMCLK samples the TMDATA level. The VPPTMCLK begins the unlock procedure by falling from high to low and then continuing to provide a periodic clock signal. Data signals are received serially at the TMDATA input. Data is changed on TMDATA during either the high or low portions of the VPPTMCLK. The data is sampled on both the rising and falling edges of the VPPTMCLK clock signal. Therefore, for the total of 5½ periods of VPPTMCLK shown in FIG. 5B, there are 11 data signals on TMDATA which are captured. For the embodiment shown in FIG. 5B, the resulting input sequence must be {1, 1, 0, 1, 1, 1, 1, 1, 0, 1, 1} to produce a VALIDKEY output signal and unlock the decoder. For another embodiment using the POR input, if the sequence is any other pattern, it can be reset only by re-powering the chip (POR= low to high), and then starting the sequence again. Additionally, if the lock EN signal goes low when the key sequence is being entered, as a result of the VPPTMCLK going low for too long, the sequence will not produce a VALIDKEY output and the system will remain locked.

Figure 6A:
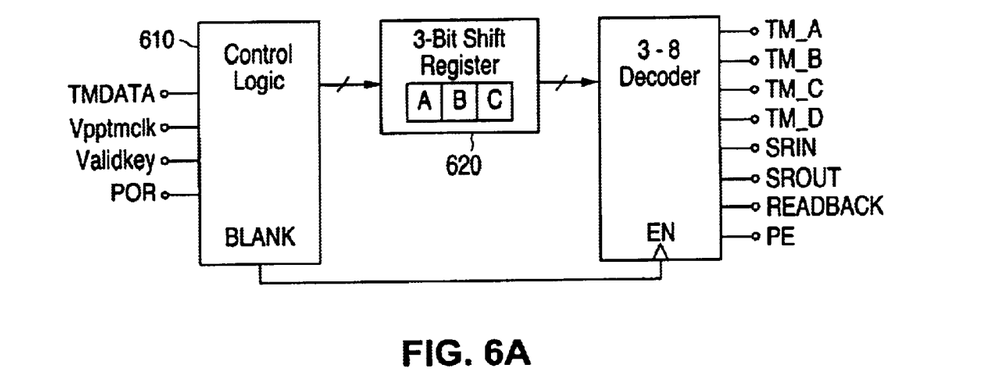
FIG. 6A is a diagram of a decoder circuit in accordance with one embodiment of the present invention.

After the system has been unlocked by the predetermined sequence of the VPPTMCLK and TMDATA, the system can receive commands to either activate one of the test modes TM_A, TM_B, TM_C, and TM_D, or conduct a transaction with the memory unit 360 of FIG. 3. Commands are communicated to the protocol logic interface over the VPPTMCLK and TMDATA lines. FIG. 6A illustrates a decoder 600 for receiving the commands according to one embodiment of the present invention. Commands are received serially on the TMDATA line by decoder control logic 610 and clocked into a shift register 620 by VPPTMCLK. The VALIDKEY output signal from the lock circuit is also input to the decoder control logic to deactivate the decoder if the VALIDKEY signal is not active. The output of the decoder is comprised of four test mode signals TM_A, TM_B, TM_C, and TM_D, and control signals for interfacing with the memory unit. The decoder of the current embodiment includes a signal for serially transferring data into the memory unit SRIN, a signal for serially transferring data out of the memory unit SROUT, a program enable signal PE to program the non-volatile portion of the memory unit, and a read back signal READBACK which allows the user to execute a parallel shift of the data stored in the non-volatile memory into the volatile memory. Finally, the decoder control logic also issues a blanking signal BLANK to deactivate all the outputs of the decoder when no activities are required.

The decoder is therefore a one or nothing decoder as illustrated in Table 1 below.

TABLE 1

| A | B | C | BLANK | OUT |
|---|---|---|-------|-----|
| 0 | 0 | 0 | 0 | TM_A |
| 0 | 0 | 1 | 0 | TM_B |
| 0 | 1 | 0 | 0 | TM_C |
| 0 | 1 | 1 | 0 | TM_D |
| 1 | 0 | 0 | 0 | READBACK |
| 1 | 0 | 1 | 0 | SRIN |
| 1 | 1 | 0 | 0 | SROUT |
| 1 | 1 | 1 | 0 | PE |
| dc | dc | dc | 1 | ALL OFF |

Figure 6B:
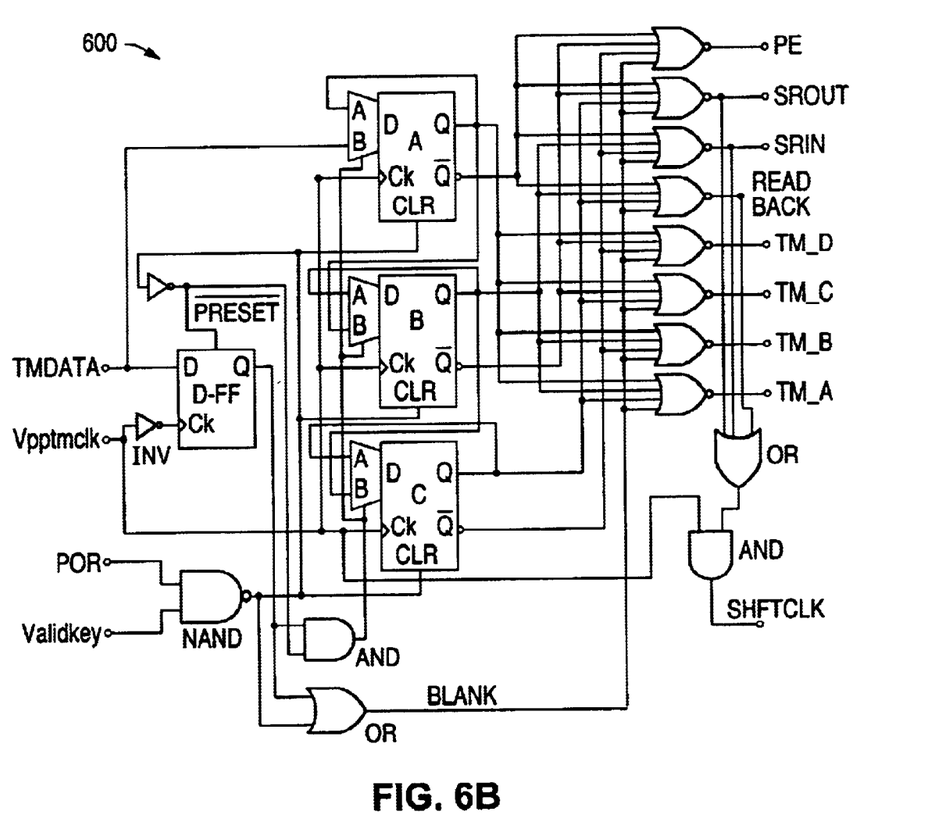
FIG. 6B is a diagram of a decoder circuit in accordance with another embodiment of the present invention.

FIG. 6B illustrates another embodiment of the decoder circuit. The decoder 600 includes a D-FF (D-type flip-flop) for receiving TMDATA and an inverted VPPTMCLK. The D-FF is used to store the value of TMDATA for each falling edge of the clock signal VPPTMCLK and thereby control the BLANK signal and the shifting of the shift register. The shift register is comprised of three D-FF's and three 2×1 MUX's (2:1 multiplexors) as is well known in the art. The output of the decoder is comprised of the eight outputs TM_A, TM_B, TM_C, TM_D, READBACK, PE, SRIN, and SROUT, which are controlled by the logical relations of the NOR gates, the D-FF's, and the BLANK signal as shown. Control of the BLANK signal and the shift register is facilitated by an inverter INV, a NAND gate, a AND gate and an OR gate which receive as inputs VPPTMCLK, TMDATA, POR, and VALIDKEY signals and are connected substantially as shown. The decoder of FIG. 6B also includes the optional components comprising an OR gate an AND gate coupled to VPPTMCLK and the outputs SRIN, SROUT, and READBACK that are connected substantially as shown for providing a clock to the volatile memory in the memory unit.

Figure 7A:
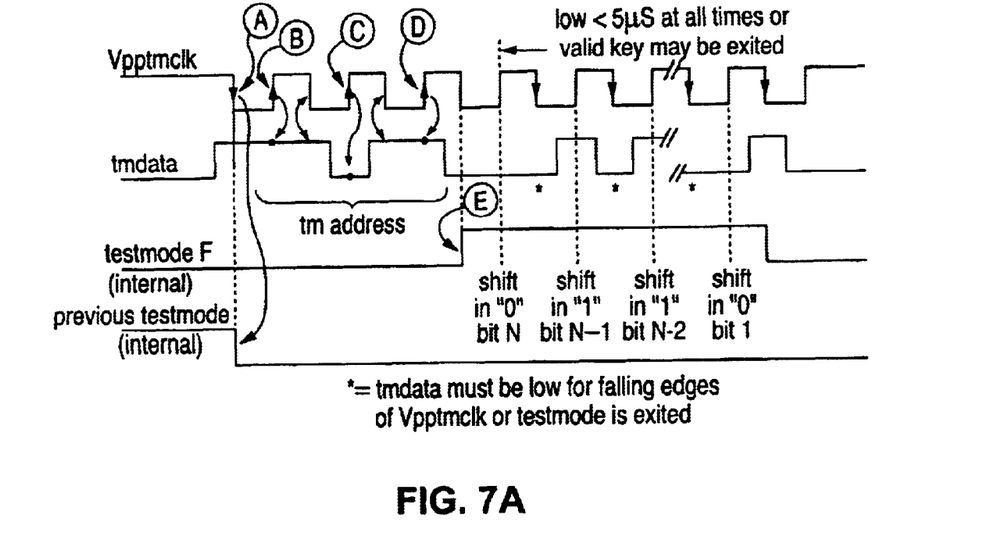
FIG. 7A is a timing diagram for illustrating the communication protocol for serially shifting bits into an electronic system in accordance with one embodiment of the present invention.

The operation of the decoder and the protocol for controlling the configuration of the electronic system of the present invention will now be described. FIG. 7A illustrates a waveform sequence for programming the decoder to output SRIN for shifting data into the memory unit, for example. Initially, when the VALIDKEY signal is not active the BLANK signal forces all the outputs of the decoder to be inactive, and therefore, no activity takes place. After the VALIDKEY output of the lock circuit is activated by the proper sequence of the VPPTMCLK and TMDATA lines, TMDATA can be sampled on the next falling edge of VPPTMCLK, shown at A of FIG. 7A. If the first value of TMDATA is high the BLANK signal is activated and the output of the decoder is cleared. This will also have the effect of clearing the previous test mode if the system is sequencing between test modes and/or memory unit transactions. Additionally, a high value of TMDATA on the falling edge indicates that the system should shift the data value at the next rising edge of VPPTMCLK into the shift register. On the next rising edge of VPPTMCLK, shown at B, the value of TMDATA is latched into the first position of the shift register 620. On the next falling edge of VPPTMCLK, the data must remain high or else the BLANK signal will be deactivated and the data will no longer be shifted into the shift register. On the next rising edge, at C, the value of '0' is shifted into the first position in the shift register and the '1' in the first position is shifted to the second position in the shift register. The value of TMDATA then transitions back to high so that the next falling edge of VPPTMCLK reads a high and the BLANK signal is not deactivated an the data shifting can continue. On the next rising edge of VPPTMCLK, at D, the final value of '1' is shifted into the shift register. TMDATA then transitions to low and the value of '010' in the shift register activates the serial input SRIN control node of the decoder output on the next falling edge of VPPTMCLK. When the SRIN control node is activated, the memory unit is signaled that a serial data input transaction is going to occur. For the serial data input function of FIG. 7A, data on the TMDATA line is shifted in on the rising edge of the VPPTMCLK. However, the TMDATA line must go low during the falling edge of the VPPTMCLK or else the BLANK signal is activated and the decoder is cleared. Therefore, it can be seen that the TMDATA line is related to the VPPTMCLK in two ways. When the serial decoder control bits are being loaded, TMDATA must be high during the falling edges of VPPTMCLK or the BLANK signal is deactivated and the data shift stops. Additionally, during a serial data in/out cycle TMDATA must be low during the falling edges of VPPTMCLK or the decoder output is cleared. Finally, if VPPTMCLK goes low for greater than the time programmed in the clock receiver, the VALIDKEY signal will be deactivated and access to the system will be terminated.

Figure 7B:
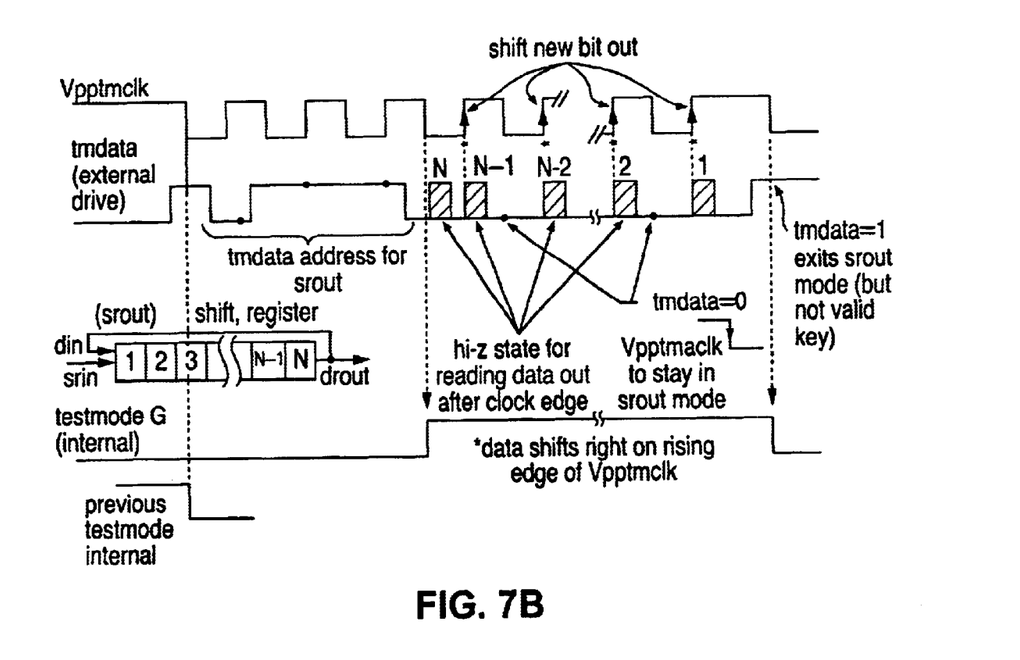
FIG. 7B is a timing diagram for illustrating the communication protocol for serially shifting bits out of an electronic system in accordance with one embodiment of the present invention.
Figure 7C:
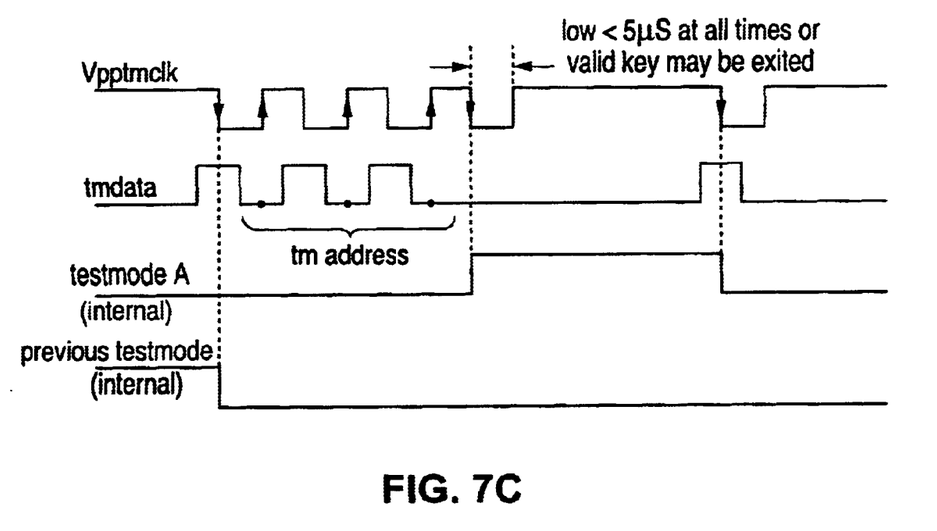
FIG. 7C–FIG. 7F are timing diagrams for illustrating the communication protocol for entering the test modes in accordance with one embodiment of the present invention.
Figure 7D:
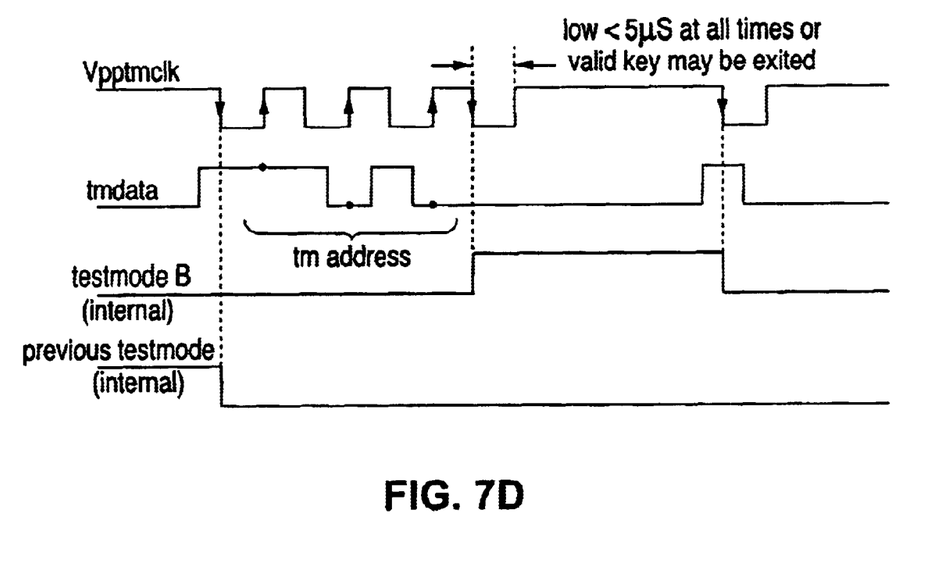
Figure 7E:
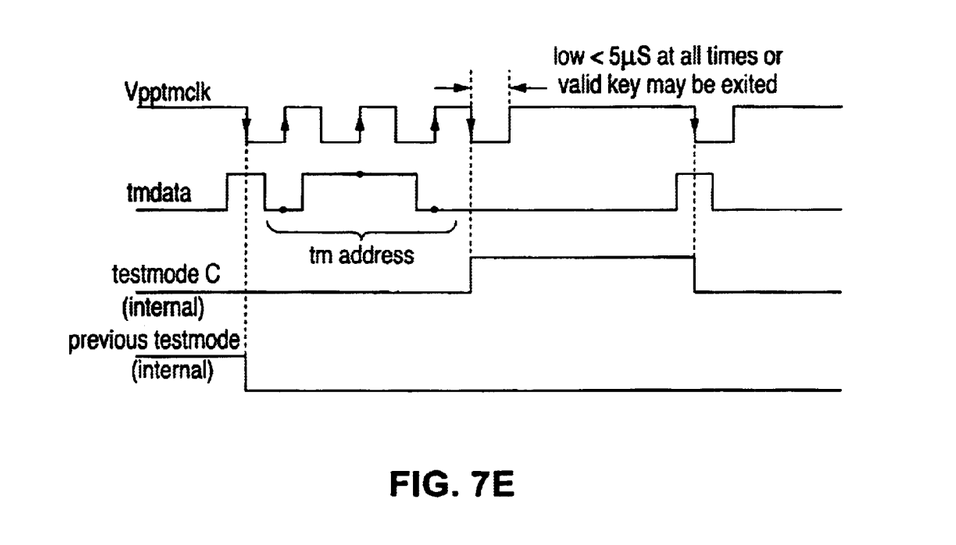
Figure 7F:
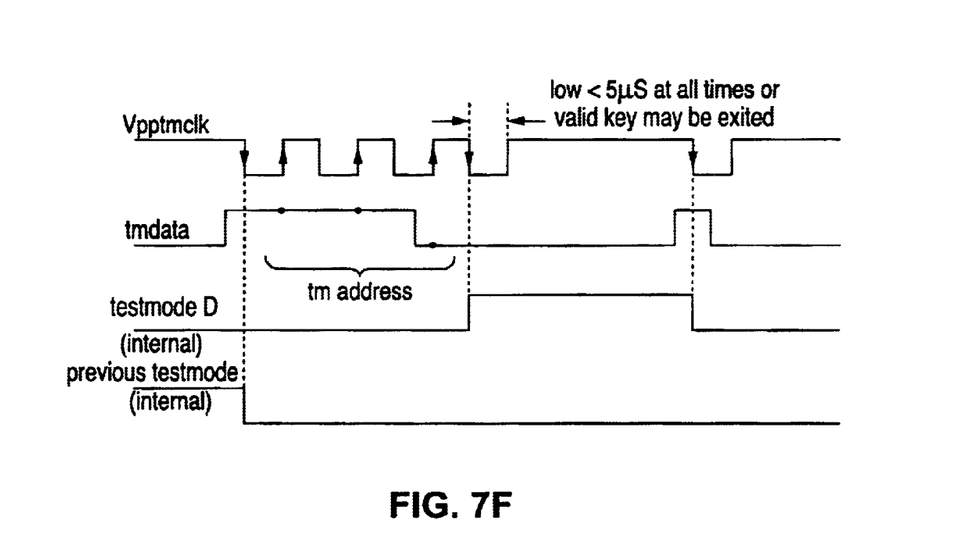

Operating in a similar manner, the waveforms of FIG. 7B illustrate the protocol for activating the SROUT signal and controlling a serial data output function. First, the serial decoder control bits of the protocol are read by the decoder in the same manner as above. Then the SROUT signal is activated and data in the volatile memory is serially shifted out of the memory unit with each subsequent rising edge transition of the VPPTMCLK, highest bit first. However, in this case, devices connected to the TMDATA line must be put into a high impedance ("HI-Z") state so data can be transferred out of the system. Note again that the TMDATA line must be low for each falling edge of the VPPTMCLK or the serial read mode will be cleared. When the data has been read out of the memory unit, TMDATA goes high, and the decoder is cleared to the BLANK mode on the next falling edge.

FIGS. 7C–7F illustrate the protocol for activating the test mode outputs TM_A, TM_B, TM_C, and TM_D. Again TMDATA and VPPTMCLK begin the protocol sequence in a high state and the previous test mode is cleared by a falling edge of the VPPTMCLK when TMDATA is high. As illustrated in FIGS. 7C–7F, once the serial decoder bits for a test mode have been entered into the decoder, and the corresponding test mode output activated, TMDATA remains low until a signal is transmitted over the TMDATA line which indicates that the test mode can be cleared.

Figure 7G:
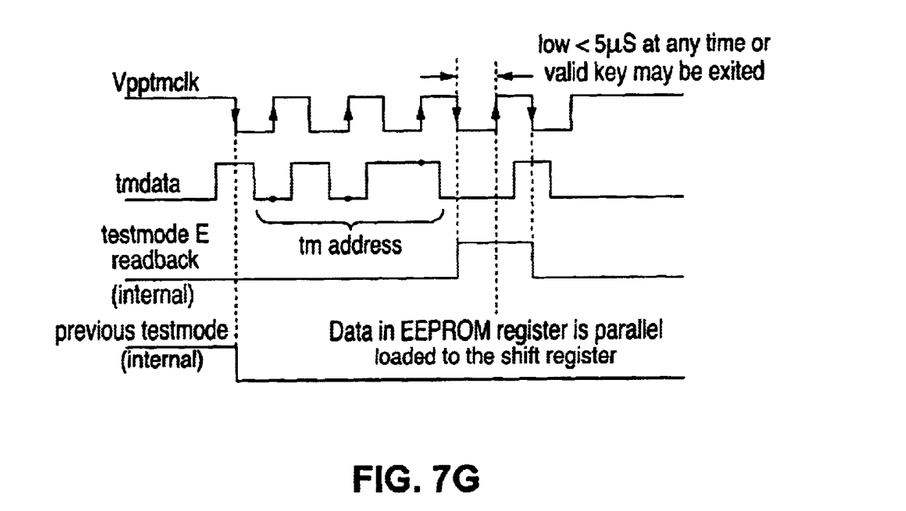
FIG. 7G is a timing diagram for illustrating the communication protocol for reading data from the non-volatile memory into volatile memory in accordance with one embodiment of the present invention.

FIG. 7G illustrates the protocol for activating the READBACK signal and controlling a read back command. The serial decoder control bits are communicated to the decoder using the protocol as described above. After the serial decoder control bits have been received by the decoder, TMDATA transitions low and the next falling edge of VPPTMCLK activates the READBACK output of the decoder. This signal is transmitted to the memory unit causing a parallel transfer of the data in the non-volatile memory into the volatile memory. After the parallel transfer has been completed, TMDATA transitions back to high and the READBACK output of the decoder is cleared on the next falling edge of the VPPTMCLK.

Figure 7H:
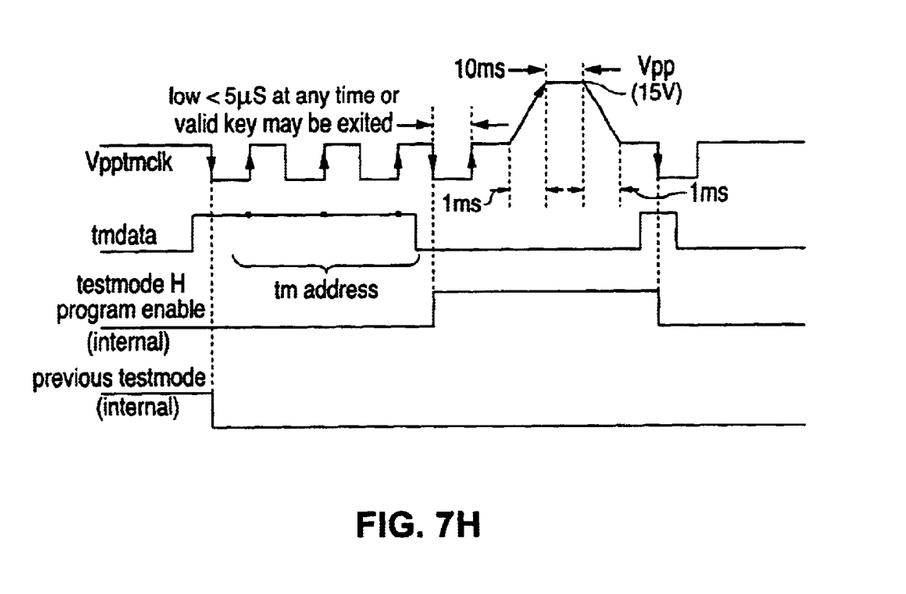
FIG. 7H is a timing diagram for illustrating the communication protocol for programming non-volatile memory in accordance with one embodiment of the present invention.

FIG. 7H illustrates the protocol for activating the program enable PE signal and controlling a non-volatile memory programming function. During normal data transfer into the protocol logic interface, VPPTMCLK will transition between normal logic high and low levels defined by the particular characteristics of the device. For example, an electronic system running on a 5 volt supply using a standard CMOS technology would define logic levels between 0 volts (logic low) and 5 volts (logic high). Other logic high and logic low voltages could be used as well as other supply voltages for the system. However, for one embodiment of the present invention, a pulse on the VPPTMCLK line is use to supply the programming voltage to the non-volatile memory portion of the memory unit. For example, an electrically erasable programmable read only memory ("EEPROM") may require a programming voltage of 15 volts to store data in the EEPROM. As illustrated in FIG. 7H, VPPTMCLK and TMDATA are driven with the normal protocol to activate the PE output signal of the decoder. After the serial decoder control bits corresponding to a PE command are entered, TMDATA goes low and the PE signal is activated on the next falling edge of VPPTMCLK. Then, as shown in FIG. 7H, a predetermined time after the next rising edge of VPPTMCLK, the voltage on VPPTMCLK is increased to the necessary level to program the EEPROM, here 15 volts. The signal is held for a predetermined time necessary to program the EEPROM, which in this case in 10 ms, and then the voltage on VPPTMCLK is reduced back down to within the normal logic operating levels. TMDATA is then set to a high level, and on the next falling edge of VPPTMCLK, the PE mode is cleared in the decoder.

From the waveforms illustrated in FIGS. 7A–H, it can be seen that TMDATA can be broken into segments of serial packets for representing the protocol. The first serial packet of the protocol is a key portion, followed by the second serial packet of the protocol comprised of the serial decoder control bits. The final part of the protocol is the data in or data out which will vary depending on the size and configuration of the memory being used in the system. Without the required serial key, a communication link between an external device and the protocol logic interface unit cannot be established. However, once the link is established, serial control information and data can be transmitted to the protocol logic interface unit to bring internal nodes to device output pins, reconfigure the functionality of the electronic system, and change the electrical behavior of the system by programming DAC's or reconfiguring switching networks to reconfigure the circuits.

Figure 8:
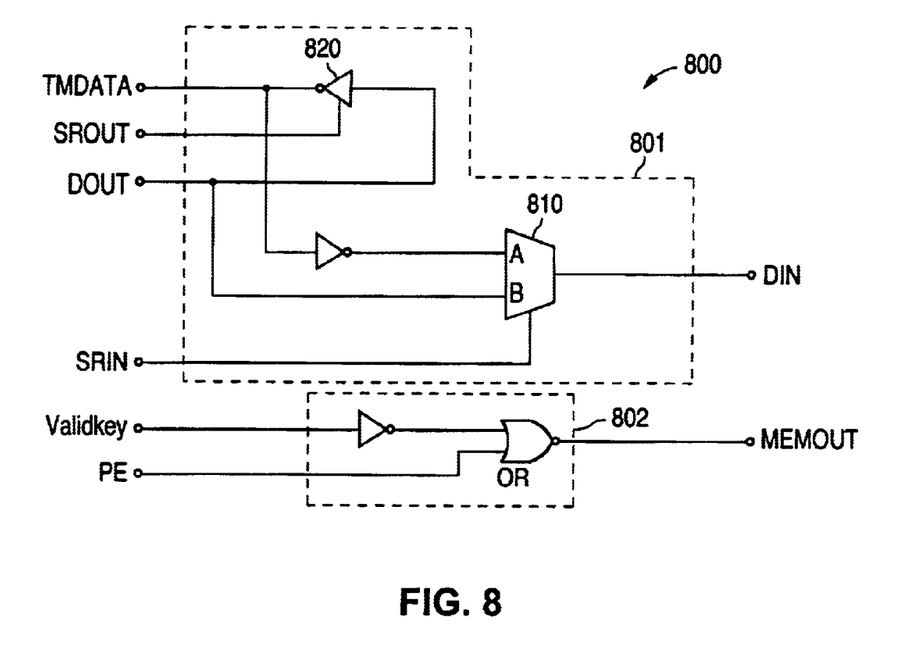
FIG. 8 is a diagram of a memory unit controller in accordance with one embodiment of the present invention.
Figure 9:
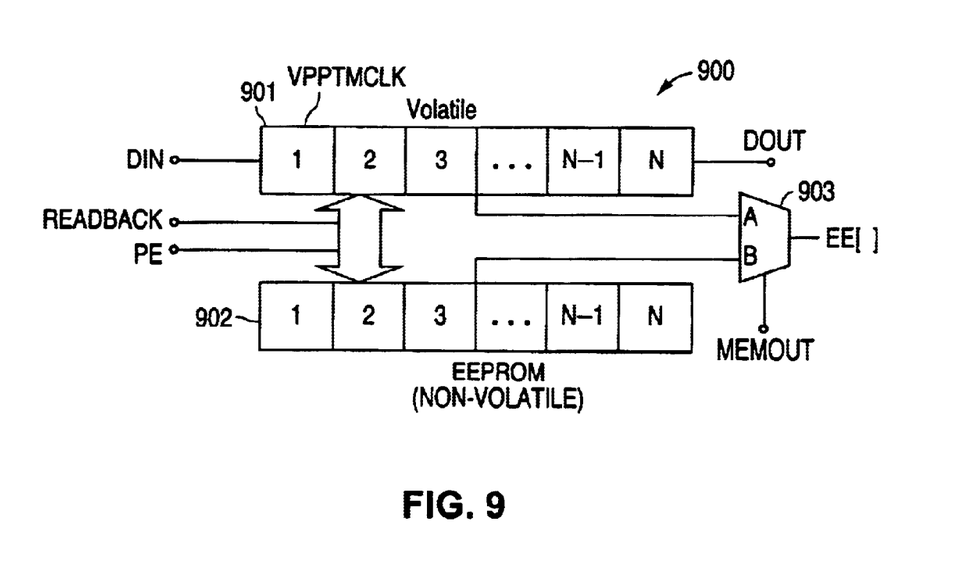
FIG. 9 is a diagram of a memory unit in accordance with one embodiment of the present invention.

FIG. 8 illustrates one embodiment of the EE controller 340 of FIG. 3 according to one embodiment of the present invention. The EE controller 800 of FIG. 8 includes a data flow controller circuit 801 for controlling the flow of data into and out of the memory unit. Additionally, the EE controller includes a memory output controller 802. Memory output controller 802 allows the user to program which portion of the memory unit will drive the memory lines in the system EE[N]. FIG. 9 shows a memory unit 900 according to one embodiment of the present invention. Memory unit 900 includes a volatile memory 901, which could be an array of latches for example, a non-volatile memory 902, which could be an EEPROM for example, and a multiplexor 903. With reference to FIG. 2, FIG. 8, and FIG. 9, data from the TMDATA is shifted serially into the volatile memory through multiplexor 810 when the SRIN output of the decoder is active. Data is entered into the volatile memory most significant bit first. Data can be programmed into the EEPROM after having been loaded into the volatile memory by activating the PE signal on the output of the decoder. Data from the EEPROM can also be loaded back into the volatile memory by activating the READBACK signal on the output of the decoder. To read data out of the system, the serial decoder control bits for SROUT must be transmitted. When SROUT is activated, output buffer 820 is put into a HI-Z mode, which allows data to be driven onto the TMDATA line. Additionally, SRIN is deactivated, so as data is shifted out of the volatile memory onto the TMDATA line, most significant bit first, it is automatically reloaded back into the volatile memory through the DIN input. After all the data bits have been shifted onto the TMDATA line, the data will be back in position in the volatile memory. Finally, when the VALID-KEY signal is active and PE is inactive, the output of the memory unit EE[N] will be driven by the contents of the volatile memory rather than by the contents of the EEPROM. This feature allows the user to change the settings of internal DAC's or switching networks quickly using the volatile memory to find the desired settings. Once the desired settings are found, the contents of the volatile memory can be permanently stored in the EEPROM by activating the PE output of the decoder, thereby programming the values into the EEPROM.

In the foregoing specification, the invention has been described with reference to specific exemplary embodiments thereof. It will, however, be evident that various modifications and changes can be made thereto without departing from the broader spirit and scope of the invention as set forth in the appended claims. For example, logic signals could take on opposite polarities and active signals could be active "high" (indicating that a high logic level is active) or active "low" (indicating that a low logic level is active), while still maintaining the necessary relationships encompassed by the spirit and scope of the invention. The specification and drawings are, accordingly, to be regarded in an illustrative rather than restrictive sense.

What is claimed is:

1. An apparatus including an integrated circuit with mixed signal circuitry and configuration, control and testing circuitry for said mixed signal circuitry, comprising:

a plurality of input terminals for conveying a plurality of input signals including a plurality of configuration control signals;

a plurality of interface terminals for conveying a plurality of interface signals including a plurality of analog interface signals;

interface circuitry, coupled to said plurality of input terminals, that provides a plurality of configuration data and a plurality of switch control signals in response to said plurality of configuration control signals;

memory circuitry, coupled to said interface circuitry, that stores said plurality of configuration data;

analog circuitry with a plurality of internal circuit terminals and a plurality of external circuit terminals, coupled to said memory circuitry, that is electrically configurable and communicates a plurality of internal analog signals and a plurality of external analog signals via said plurality of internal circuit terminals and said plurality of external circuit terminals, respectively, in response to a portion of said plurality of configuration data; and switching circuitry, coupled between said plurality of internal circuit terminals, said plurality of external circuit terminals and said plurality of interface terminals, that alternately couples respective ones of said pluralities of internal and external circuit terminals to corresponding ones of said plurality of interface terminals in response to said plurality of switch control signals;

wherein respective ones of said pluralities of internal and external analog signals change in response to corresponding changes in respective ones of said portion of said plurality of configuration data.

2. The apparatus of claim 1, wherein said interface circuitry comprises data decoding circuitry, coupled to said plurality of input terminals, that decodes said plurality of configuration control signals to provide said plurality of configuration data and said plurality of switch control signals.

3. The apparatus of claim 2, wherein said interface circuitry further comprises lock decoding circuitry, coupled between said plurality of input terminals and said data decoding circuitry, that enables and disables said data decoding circuitry in response to said plurality of configuration control signals.

4. The apparatus of claim 1, wherein said memory circuitry comprises:

a first memory circuit that stores said plurality of configuration data substantially during said coupling of said respective ones of said pluralities of internal circuit terminals to said corresponding ones of said plurality of interface terminals by said switching circuitry in response to said plurality of switch control signals; and a second memory circuit that stores said plurality of configuration data substantially during said coupling of said respective ones of said pluralities of external circuit terminals to said corresponding ones of said plurality of interface terminals by said switching circuitry in response to said plurality of switch control signals.

5. The apparatus of claim 4, wherein:
   said first memory circuit comprises volatile memory circuitry; and
   said second memory circuit comprises nonvolatile memory circuitry.

6. The apparatus of claim 1, wherein said memory circuitry comprises:
   a first memory circuit that stores a first portion of said plurality of configuration data during a production test of said integrated circuit; and
   a second memory circuit that stores a second portion of said plurality of configuration data during a use of said integrated circuit subsequent to said production test.

7. The apparatus of claim 1, wherein said switching circuitry comprises a plurality of switch circuits.

8. The apparatus of claim 1, further comprising digital circuitry, coupled to said memory circuitry, that is electrically configurable and provides a plurality of digital signals in response to another portion of said plurality of configuration data, wherein said analog circuitry is further coupled to said digital circuitry and is electrically configurable and provides said plurality of internal analog signals and said plurality of external analog signals via said plurality of internal circuit terminals and said plurality of external circuit terminals, respectively, in response to said portion of said plurality of configuration data and said plurality of digital signals.

9. The apparatus of claim 1, wherein said plurality of input terminals comprises:
   a first terminal for conveying a serial data signal; and
   a second terminal for conveying a clock signal.

10. An apparatus including control circuitry with a dual signal interface for controlling enablement and disablement of a synchronous system, comprising:
    a data signal terminal for conveying a serial data signal with first and second opposing signal states and first and second opposing signal transitions between said first and second opposing data signal states;
    a clock signal terminal for conveying a clock signal with first and second opposing signal states and first and second opposing signal transitions between said first and second opposing clock signal states; and
    an enablement control circuit, coupled to said data and clock signal terminals, that provides
       an asserted system enablement control signal in response to said data and clock signals following reception of a predetermined sequence of said first and second opposing data signal states and said first and second opposing clock signal state transitions, wherein said predetermined sequence includes
          an initial first clock signal state transition coincident with said first data signal state and
          coincidence of respective ones of said first and second opposing data signal states and said first and second opposing clock signal state transitions, and
       a nonasserted system enablement control signal in response to said first clock signal state having a duration greater than a predetermined interval.

11. The apparatus of claim 10, wherein said enablement control circuit comprises a state machine.

12. An apparatus including control circuitry with a dual signal interface for controlling a plurality of operational modes of a synchronous system, comprising:
    a data signal terminal for conveying a serial data signal with first and second opposing signal states and first and second opposing signal transitions between said first and second opposing data signal states;
    a clock signal terminal for conveying a clock signal with first and second opposing signal states and first and second opposing signal transitions between said first and second opposing clock signal states; and
    a mode control circuit, coupled to said data and clock signal terminals, that provides
       an asserted one of a plurality of operation mode control signals in response to said data and clock signals following reception of a predetermined sequence of said first and second opposing data signal states and said first and second opposing clock signal state transitions, wherein said predetermined sequence includes
          coincidence of said first clock signal state transitions with said second data signal state and
          coincidence of respective ones of said first and second opposing data signal states and said second opposing clock signal state transitions, and
       a plurality of nonasserted operation mode control signals in response to said first clock signal state having a duration longer than a predetermined interval.

13. The apparatus of claim 12, wherein said predetermined sequence further includes an initial coincidence of an initial one of said first clock signal state transitions with said second data signal state.

14. The apparatus of claim 12, wherein said mode control circuit further provides said plurality of nonasserted operation mode control signals in response to a final coincidence of a final one of said first clock signal state transitions with said second data signal state.

15. The apparatus of claim 12, wherein said mode control circuit comprises:
    control logic circuitry that provides a plurality of mode control data in response to said data and clock signals; and
    decoder circuitry that decodes said plurality of mode control data and provides said plurality of operation mode control signals.

16. The apparatus of claim 15, wherein said control logic circuitry includes a shift register.

17. The apparatus of claim 15, wherein said control logic circuitry comprises a plurality of flip-flops and multiplexors that capture and multiplex said data signal in response to reception of said data and clock signals.

18. The apparatus of claim 12, further comprising a synchronous circuit, coupled to said data signal terminal, said clock signal terminal and said mode control circuit, that operates in a plurality of synchronous operation modes corresponding to said plurality of operation mode control signals subsequent to said reception of said predetermined sequence and in response to reception of said plurality of operation mode control signals, said data signals and said clock signals.

19. The apparatus of claim 18, wherein said synchronous circuit comprises a shift register that performs a serial data shift operation in response to reception of:
    a corresponding asserted one of said plurality of operation mode control signals;
    said first clock signal state transitions coincident with said first data signal state; and
    said second clock signal state transitions.

20. The apparatus of claim 18, wherein said synchronous circuit comprises a data storage circuit that performs a parallel data transfer operation in response to reception of:

a corresponding asserted one of said plurality of operation mode control signals; and one of said first clock signal state transitions coincident with said first data signal state.

21. The apparatus of claim 18, wherein said synchronous circuit comprises:

a plurality of internal circuit terminals;

a plurality of external circuit terminals;

a plurality of output terminals for conveying a plurality of output signals; and switching circuitry, coupled between said plurality of internal circuit terminals, said plurality of external circuit terminals and said plurality of output terminals, that alternately couples respective ones of said pluralities of internal and external circuit terminals to corresponding ones of said plurality of output terminals in response to reception of a corresponding asserted one of said plurality of operation mode control signals, and one of said first clock signal state transitions coincident with said first data signal state.

22. An apparatus including control circuitry with a dual signal interface for controlling enablement, disablement and a plurality of operational modes of a synchronous system, comprising:

a data signal terminal for conveying a data signal with first and second opposing signal states and first and second opposing signal transitions between said first and second opposing data signal states;

a clock signal terminal for conveying a clock signal with first and second opposing signal states and first and second opposing signal transitions between said first and second opposing clock signal states;

an enablement control circuit, coupled to said data and clock signal terminals, that provides an asserted system enablement control signal in response to said data and clock signals following reception of a predetermined sequence of said first and second opposing data signal states and said first and second opposing clock signal state transitions, wherein said predetermined sequence includes an initial first clock signal state transition coincident with said first data signal state and coincidence of respective ones of said first and second opposing data signal states and said first and second opposing clock signal state transitions, and a nonasserted system enablement control signal in response to said first clock signal state having a duration greater than a predetermined interval; and a mode control circuit, coupled to said enablement control circuit and said data and clock signal terminals, that provides an asserted one of a plurality of operation mode control signals in response to said asserted system enablement control signal and said data and clock signals following reception of a predetermined sequence of said first and second opposing data signal states and said first and second opposing clock signal state transitions, wherein said predetermined sequence includes coincidence of said first clock signal state transitions with said second data signal state and coincidence of respective ones of said first and second opposing data signal states and said second opposing clock signal state transitions, a plurality of nonasserted operation mode control signals in response to said first clock signal state having a duration longer than a predetermined interval, and said plurality of nonasserted operation mode control signals in response to said nonasserted system enablement control signal.

* * * * *